(12) United States Patent
Watanabe et al.

(10) Patent No.: US 7,718,117 B2
(45) Date of Patent: May 18, 2010

(54) TUNGSTEN SPUTTERING TARGET AND METHOD OF MANUFACTURING THE TARGET

(75) Inventors: Koichi Watanabe, Kanagawa (JP); Yoichiro Yabe, Kanagawa (JP); Takashi Ishigami, Kanagawa (JP); Takashi Watanabe, Kanagawa (JP); Hitoshi Aoyama, Kanagawa (JP); Yasuo Kohsaka, Kanagawa (JP); Yukinobu Suzuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 372 days.

(21) Appl. No.: 10/363,257

(22) PCT Filed: Sep. 3, 2001

(86) PCT No.: PCT/JP01/07612

§ 371 (c)(1),
(2), (4) Date: Aug. 27, 2003

(87) PCT Pub. No.: WO02/20865

PCT Pub. Date: Mar. 14, 2002

(65) Prior Publication Data

US 2005/0029094 A1    Feb. 10, 2005

(30) Foreign Application Priority Data

Sep. 7, 2000  (JP) .............................. 2000-270998
May 30, 2001  (JP) .............................. 2001-161617

(51) Int. Cl.
*B22F 1/02*    (2006.01)
*C23C 14/00*   (2006.01)

(52) U.S. Cl. ...................... 419/38; 419/28; 419/29; 419/54; 204/298.13; 204/192.1; 204/192.13; 420/430

(58) Field of Classification Search ............... 419/38
See application file for complete search history.

(56) References Cited

U.S. PATENT DOCUMENTS 5,009,765 A * 4/1991 Qamar et al. .......... 204/298.12
5,455,107 A * 10/1995 Homma et al. ............. 442/60

(Continued)

FOREIGN PATENT DOCUMENTS

JP    04-160104    6/1992

(Continued)

OTHER PUBLICATIONS

Richard Cheney, "Sintering of Tungsten and Molybdenum," ASM Handbook vol. 7, pp. 496-498.*

*Primary Examiner*—Roy King
*Assistant Examiner*—Christopher Kessler
(74) *Attorney, Agent, or Firm*—Oblon, Spivak, McClelland, Maier & Neustadt, L.L.P.

(57) ABSTRACT

A method of manufacturing a tungsten sputtering target includes pressing a high purity tungsten powder to form a pressed compact, first sintering the pressed compact at a temperature of 1450-1700° C. for one hour or longer after the pressed compact is heated at a heating-up rate of 2-5° C./min on the way to a maximum sintering temperature, second sintering the pressed compact to form a sintered body at a temperature of 1900° C. or higher for 5 hours or longer, working the sintered body to obtain a shape of a target, subjecting the target to a grinding work of at least one of rotary grinding and polishing, and subjecting the target to a finishing work of at least one of etching and reverse sputtering.

1 Claim, 1 Drawing Sheet

U.S. PATENT DOCUMENTS

| | | | |
|---|---|---|---|
| 5,470,527 A * | 11/1995 | Yamanobe et al. | 419/53 |
| 6,073,830 A * | 6/2000 | Hunt et al. | 228/203 |
| 6,200,694 B1 * | 3/2001 | Kohsaka et al. | 428/663 |
| 6,284,111 B1 * | 9/2001 | Takahashi et al. | 204/298.12 |
| 6,309,593 B1 * | 10/2001 | Sato et al. | 419/45 |
| 6,328,927 B1 * | 12/2001 | Lo et al. | 419/45 |
| 6,582,535 B1 * | 6/2003 | Suzuki et al. | 148/513 |

FOREIGN PATENT DOCUMENTS

| | | | |
|---|---|---|---|
| JP | 07076771 A * | 3/1995 |
| JP | 08250427 A * | 9/1996 |
| JP | 08-250427 | 9/1998 |
| JP | 11-092851 | 4/1999 |
| JP | 2000-239837 | 9/2000 |

* cited by examiner

FIG. 1

TUNGSTEN SPUTTERING TARGET AND METHOD OF MANUFACTURING THE TARGET

TECHNICAL FIELD

The present invention relates to a tungsten (W) sputtering target and a method of manufacturing the same.

BACKGROUND ART

In electronic parts represented by semiconductor element and liquid crystal display element or the like, a high purity metal of tungsten (W), molybdenum (Mo), tantalum (Ta), titanium (Ti), zirconium (Zr) and cobalt (Co) or the like and silicide compounds of these metals have been used as a material for constituting electrodes such as a gate electrode or the like and wiring material.

In recent years, those electronic parts have been rapidly advanced. In particular, in technical field of the semiconductor element represented by DRAM (Dynamic Random Access Memory), logic LSI, flash memory or the like, demand for high-integration, high-reliability, highly functional performance, high speed processing has been increased, so that an accuracy or precision in finely working technology required to form the electrodes or wirings has been further emphasized.

Further, in order to meet the above demand, it is essential to reduce a resistance of the material for forming the electrode or the wiring.

Conventionally, as the material for forming the electrodes or the wirings used in LSI, for example, silicide compounds represented by $MoSi_x$ or $WSi_x$ or the like have been widely used. However, in these days, there have been eagerly reviewed materials having a lower electrical resistance. Among such the materials, tungsten (W) has a low electrical resistance and is also excellent in heat resistance, so that W has attracted engineer's attention as a future material for constituting the electrodes and wirings.

The electrodes and wirings composed of W can be obtained in such a manner that W thin film is formed on a substrate and then the thin film is worked to form a predetermined wiring pattern by an etching treatment or the like. As a representative film forming method, sputtering method and CVD (chemical vapor deposition) method have been widely adopted.

Conventionally, the sputtering method has been mainly used as the method of forming the electrodes and wirings. In the sputtering method, W sputtering target is subjected to a sputtering operation in a vacuum chamber by utilizing noble gas represented by argon (Ar) or krypton (Kr), whereby the W films are formed.

As for the W film represented by a blanket W, the W film can be also formed by a technology using CVD method. However, the sputtering method has great advantages such that a film forming speed is more rapid, a plasma-damage against a priming film is small, and a handling operation is easy in comparison with CVD method. Therefore, there is a high possibility that the sputtering method will be mainly adopted as a future method of forming the electrodes.

By the way, till the present status, a size of Si wafer used in LSI has been shifted from 6-inches to 8-inches, and now, Si wafer having a size of 8-inches has been mainly used. However, it is estimated that the size of the Si wafer will be further scaled up to 12-inches (diameter of 300 mm) in the near future. Although the size of the sputtering target is different depending on types of sputtering devices, the size of the sputtering target corresponding to 8-inch sized Si wafer is generally 300 mm in diameter. Further, a target size of 400 mm or more in diameter may be required for a wafer of 12-inches class.

As a first problem to be posed by the scale up of the wafer size, an in-plain uniformity in thickness of the thin film formed from a large sized target is lowered. In this connection, "in-plain uniformity" means a uniformity or homogeneity of an entire thin film formed on one plain surface of a wafer having a predetermined diameter. Particularly, in case of the electrode used in LSI, a specific resistance of the electrode is greatly fluctuated depending on a difference in thickness of the film constituting the electrode. As a result, the fluctuation has much effect on characteristics of a transistor. In other words, when the uniformity in thickness of the thin film formed as the electrode is not good, a production yield of LSI is lowered and thus exerting a great damage for the LSI manufacturer.

The in-plain uniformity in thickness of the thin film formed by the sputtering operation is greatly influenced by the sputtering conditions i.e., various parameters such as an input power level, gas pressure, distance between the target and a substrate (wafer) or the like. However, even if these parameters are strictly controlled, the in-plain uniformity in thickness of the thin film, which is attainable by using a conventional sputtering device offered commercially, is limited to about 3%.

As another serious problem, there has been posed a problem that particles (dusts) are liable to generate from the target during the sputtering operation. That is, when the particles generated at the film forming operation or generated after the film formation are mixed into the thin film or remain on the thin film, the following problems arise. Namely, a resistance value of the thin film is changed at a portion where the particle is mixed or remains on the thin film thereby to cause a problem of disconnection or short-circuit when the thin film is assembled as a product. Further, the portion where the particle remains is formed to be a convex shape, and the convex portion is more severely shaved than other portions at a subsequent process such as CMP (chemical mechanical polishing) process or the like, whereby a particle drops off therefrom. As a result, a concave portion having a similar shape of the particle is formed, and a resistance value of the concave portion is also changed thereby to cause the problem of the disconnection or the short-circuit when the thin film is assembled as a product. Furthermore, the concave portion is not properly etched under normal etching conditions in comparison with other normal portions, so that there is posed a problem that an accurate patterning of the circuit cannot be performed.

There are several mechanisms of generating the particles. One case is that an abnormal discharge is occurred at a surface of the sputtering target during the sputtering operation, a molten particle generated by the abnormal discharge is scattered and adhered to the wafer. Another case is that a film re-adhered to an outer peripheral portion of the sputtering target is peeled off therefrom due to heat cycle of the sputtering operation, and the peeled film segments are again adhered to the wafer.

As described above, when the uniformity in thickness of the thin film formed as the electrode is not good or the amount of the generated particles is large, the production yield of LSI is lowered and LSI maker suffers a great damage.

As to also W film, the same problems of the particle generation and the in-plain uniformity in thickness of the thin film formed from the above sputtering target are applied. As the sputtering target for forming the W film, the following W sputtering targets are well known. For example, Japanese Patent Application (Laid-Open) No. HEI-5-93267 discloses a sputtering target having a carbon content of 50 ppm or less, oxygen content of 30 ppm or less, a relative density of 97% or more, wherein crystal grains have a shape collapsed in a predetermined direction.

Japanese Patent Application (Laid-Open) No. HEI-5-222525 discloses a method of manufacturing a sputtering target comprising the steps of: pressing W powder to form a molded body having a relative density of 60% or more, heating the molded body to a temperature of 1400° C. or higher in an atmosphere containing hydrogen gas to form a sintered body having a relative density of 90% or more, and hot-working the sintered body to obtain a relative density of 99% or more.

Japanese Patent Application (Laid-Open) No. HEI-7-76771 discloses a sputtering target having a relative density of 99.5% or more and an average crystal grain size of more than 10 µm up to 200 µm.

However, even if the film forming operation is performed using the above conventional W sputtering targets under predetermined sputtering conditions, an attainable limit of the in-plain uniformity in thickness of the W thin film was about 3% and the particle reduction was not satisfactory indeed.

In recent years, in accordance with an increase of the technical demands for high integration, high processing speed, high reliability required for LSI, it has been essentially required for the material for forming the electrode and wiring to lower the resistance. In view of this demand, the material for forming the electrode has been changed from silicide to a high purity metal. Since the attainable limit of the in-plain uniformity in thickness of the W thin film formed by using the conventionally well-known sputtering target is about 3%, when the size of wafer is further increased, there must be shown a tendency that the in-plain uniformity in thickness of the thin film is greatly deteriorated.

In addition, it is also an important issue to reduce the particles generated from the sputtering target. In particular, as to the size of the particles generated by the abnormal discharge, the particles having a size of 1 µm or more are in the majority, so that the reduction of the particles having a size of 1 µm or more have been strongly demanded in these days.

If these phenomena are not eliminated, the production in the mass-producing line of LSI is greatly lowered and there may be arisen greater loss capability.

The present invention had been achieved to solve the aforementioned problems, and an object of the present invention is to provide a W sputtering target and method of manufacturing the target capable of improving the in-plain uniformity in thickness of the W thin film formed on, for example, a large-sized substrate having a diameter of 8-inches or more.

DISCLOSURE OF THE INVENTION

In order to solve the aforementioned problems, the inventors of this invention had variously reviewed about crystal orientations and crystal planes of a surface of W sputtering target, and uniformity in thickness of film formed by using the target. As a result, the inventors had found that the uniformity in thickness of W thin film formed on Si wafer having a diameter of 8-inches or more could be reduced to be 1% or lower, to which the conventional targets had never attained.

The present invention had achieved on the basis of the aforementioned findings. That is, a tungsten sputtering target according to a first invention is characterized in that a half band width of a peak corresponding to a crystal plane (110) of the target is 0.35 or less when a surface of the target to be sputtered is analyzed by X-ray diffraction. In the present invention, when the half band width of the peak corresponding to the crystal plane (110) of the surface of the target to be sputtered is set to 0.35 or less, it becomes possible to improve the in-plain uniformity in thickness of W thin film formed by using the sputtering target.

In the first invention, in addition to the half band width of the specified crystal plane (110), it is preferable that a dispersion of the half band width is 30% or less. By reducing this dispersion to 30% or less, it becomes possible to further improve the in-plain uniformity in thickness of W thin film thus formed.

Further, the inventors of the present invention had also obtained the following findings. Namely, when a specified crystal orientation ratio at the surface of the target is controlled, the uniformity in thickness of W thin film formed on a large-scaled Si wafer, for example, having a diameter of 8-inches or more could be improved to be an excellent level to which the conventional targets had never attained, and the generation of the particles could be reduced.

In a case where the sputtering operation is performed by using the conventional high purity W sputtering target, the uniformity in thickness had reached a critical limit of about 3% in regardless of the film forming conditions. In a case where the size of wafer is further increased, for example, to 12-inches wafer, the uniformity in thickness is disadvantageously increased to about 5%. The inventors of this invention had found that a releasing angle distribution of neutral grains and ions scattered from the W sputtering target was an important factor to further improve the uniformity in thickness, so that the inventors of this invention had investigated about the releasing angle distribution in various technical viewpoints. As a result, the inventors of this invention had found that a crystal orientation ratio (110)/(200) obtained from peak intensities of crystal planes (110) and (200) of a surface of the target analyzed by X-ray diffraction effectively affect on the uniformity in thickness.

From the above findings, the tungsten sputtering target according to a second invention is characterized in that a crystal orientation ratio (110)/(200) is 0.1-6.5 when a peak intensity of a crystal plane (110) and a peak intensity of a crystal plane (200) of a surface of the target to be sputtered are analyzed by X-ray diffraction.

Namely, when the above second invention is adopted, it becomes possible to improve the in-plain uniformity in thickness of the W thin film formed by using the W sputtering target.

Furthermore, when a plastic forming is performed to manufacture the W sputtering target, a slip is liable to occur due to the plastic forming. As to the slip, a slip plane and a slip direction are specified for each of the crystal structures. The phenomenon of the slip crystallographically occurs at a crystal plane where atoms are most densely existing or at a crystal plane close to the most dense crystal plane. When the slip occurs, the crystal plane is formed with fault-shaped step, so called, slip plane or slip belt. When the sputtering operation is advanced, this slip plane (slip belt) is formed with fault-shaped concavo-convex. When the sputtering operation is continued, the ups and downs of this concavo-convex are further increased. The inventors of this invention had found the following findings. That is, when the ups and downs of this concavo-convex are further increased, the electrical charge is concentrated at the convex portion of this concavo-convex, thereby to cause the abnormal discharge. As the results of the reviewing the slip, the inventors of this invention had found that a crystal orientation ratio (211)/{(110)+(200)+(211)+(220)+(310)} obtained when peak intensities of crystal planes (110), (200), (211), (220) and (310) of a surface of the target to be sputtered are analyzed by X-ray diffraction exerts an effective influence on the abnormal discharge and the particles.

On the basis of the above findings, a tungsten sputtering target of a third invention is characterized in that a crystal orientation ratio (211)/{(110)+(200)+(211)+(220)+(310)} is 0.17 or less when peak intensities of a crystal plane (110), a crystal plane (200), a crystal plane (211), a crystal plane (220) and a crystal plane (310) of a surface of the target to be sputtered are analyzed by X-ray diffraction.

Namely, when the above third invention is adopted, it becomes possible to reduce the particles to be mixed in the W film formed by using the W sputtering target.

Further, a tungsten sputtering target according to a fourth invention is characterized in that a crystal orientation ratio (110)/(200) is 0.1-6.5 and a crystal orientation ratio (211)/{(110)+(200)+(211)+(220)+(310)} is 0.17 when peak intensities of a crystal plane (110), a crystal plane (200), a crystal plane (211), a crystal plane (220) and a crystal plane (310) of a surface of the target to be sputtered are analyzed by X-ray diffraction.

Namely, when the above fourth invention is adopted, it becomes possible to improve the in-plain uniformity in thickness of the W film and to reduce the particles to be mixed in the W film formed by using the W sputtering target.

Furthermore, a method of manufacturing the high purity tungsten sputtering target according to another aspect of the present invention is characterized by comprising the steps of: pressing a high purity tungsten powder to form a pressed compact; sintering the pressed compact to form a sintered body; working the sintered body to obtain a shape of a target; subjecting the target to a grinding work of at least one of rotary grinding and polishing; and subjecting the target to a finishing work of at least one of etching and reverse sputtering.

By employing the aforementioned method of manufacturing the target, it becomes possible to manufacture the sputtering target having a predetermined half band width or less specified by the present invention.

In the method of manufacturing the tungsten sputtering target according to the present invention, it is preferable that the method further comprises an intermediate sintering step for maintaining the pressed compact at temperature of 1450-1700° C. for one hour or longer after the pressed compact is heated at a heating-up rate of 2-5° C./min on the way to a maximum sintering temperature when the high purity tungsten powder is pressed and sintered by hot pressing method.

By employing the aforementioned intermediate sintering step, it becomes possible to manufacture the sputtering target having a predetermined dispersion of the half band width or less specified by the present invention.

The configurations and structures of each of the inventions will be described hereunder in detail.

BEST MODE FOR EMBODYING THE INVENTION

Hereinafter, embodiments for embodying the present invention will be described.

A tungsten (W) sputtering target according to the present invention is characterized in that a half band width of a peak corresponding to a crystal plane (110) of the target is 0.35 or less when a surface of the target to be sputtered is analyzed by X-ray diffraction.

When the sputtering target constructed as above is used, it becomes possible to improve the in-plain uniformity in thickness of the W film. That is, for example, when a W film is formed on an Si wafer having a diameter of 8-inches or more in accordance with a sputtering method using a tungsten sputtering target, it becomes possible to improve the uniformity in thickness of the W thin film thereby to control the dispersion of the specific resistance distribution in a plain of the wafer.

In a case where the sputtering operation is performed by using the conventional high purity W sputtering target, the uniformity in thickness had reached a critical limit of about 3% in regardless of the film forming conditions. In a case where the size of wafer is further increased, for example, to 12-inches wafer, the uniformity in thickness is disadvantageously increased to about 5%.

The inventors of this invention had found that a releasing angle distribution of neutral grains and ions scattered from the W sputtering target was an important factor to further improve the uniformity in thickness, so that the inventors of this invention had investigated about this point from various technical viewpoints. As a result, the inventors of this invention had found that if a half band width of a peak of crystal plane (110) of a surface of the target analyzed by X-ray diffraction is 0.35 or less, it effectively affects on the uniformity in thickness of the thin film.

In general, as a crystal plane of a W sintered body having a body-centered cubic (BCC) structure, there are several kinds of crystal planes such as crystal plane (110), crystal plane (200), crystal plane (211), crystal plane (220), crystal plane (310) or the like. Among the above crystal planes, the crystal plane (110) is the most closest packing plane of the BCC structure, and a gap is hardly formed between the crystal lattices. Therefore, a noble gas such as Ar atom is hardly to be taken into the crystal lattice during the sputtering operation, so that a sputtering rate is considered to be the highest at the crystal plane (110). This estimation can be also understood from a fact that the crystal plane (110) shows a main peak value in JCPDS (Joint Committee on Powder Diffraction Standards) card.

Normally, the surface of the sputtering target is finished and controlled the surface condition by subjecting the surface toa mechanical grinding such as lathe work, rotary grinding, polishing or the like. However, the surface of the sputtering target is formed with many internal distortions due to the mechanical working, and the targets are usually used in this condition. As described hereinbefore, since the crystal plane (110) has the highest sputtering rate, the smaller internal distortion is included in the crystal plane (110), the crystal plane (110) exhibits the more stable releasing angle distribution. In the present invention, the internal distortion contained in the crystal plane (110) is expressed by the half band width.

In general case of the magnetron sputtering method, the temperature of the surface of the sputtering target will attain 400° C. or higher due to the generation of plasma. In this case, when the internal distortion is contained in crystal plane at surface of the target, there arise a phenomenon such that the distortion is released due to a heat affection at the sputtering operation, and there is caused a slight difference in sputtering releasing angle distribution. Therefore, when the surface of the target to be sputtered is analyzed by X-ray diffraction and the half band width of a peak corresponding to a crystal plane (110) of the target exceeds 0.35, the releasing of the internal distortion is promoted, so that the releasing angle distribution is drastically changed. Thus resulting in a bad influence on a thickness distribution of the film.

Accordingly, in order to realize a W sputtering target capable of reducing the internal distortion and obtaining a stable releasing angle distribution, the present invention specifies the half band width of a peak corresponding to a crystal plane (110) of the target to be 0.35 or less when a surface of the target to be sputtered is analyzed by X-ray diffraction. The half band width is more preferable to be 0.3 or less, furthermore preferable to be 0.2 or less, still furthermore preferable to be 0.15 or less.

It is preferable that a dispersion of the half band width of the crystal plane (110) formed in the target surface is 30% or less.

This is because when the dispersion of the entire crystal planes (110) exceeds 30 even if the half band width is within a range specified by this invention, as is the same phenomenon as described hereinbefore, the releasing angle distribution is liable to cause an unevenness, so that uniformity in thickness of the film to be formed on the wafer is deteriorated. Accordingly, the dispersion of the half band width is specified to 30% or less. This dispersion is preferable to be 20% or less, more preferably be 15% or less.

The tungsten sputtering target according to the second invention is characterized in that a crystal orientation ratio (110)/(200) is 0.1-6.5 when a peak intensity of a crystal plane (110) and a peak intensity of a crystal plane (200) of a surface of the target to be sputtered are analyzed by X-ray diffraction.

The inventors of this invention had reviewed about the in-plain uniformity in relation with the crystal plane (110) and other crystal planes. As a result, the inventors had found that a crystal orientation ratio of the crystal plane (200) exerts a great influence on the in-plain uniformity, and when a W sputtering target is prepared so that a crystal orientation ratio (110)/(200) is controlled to be a specified range, i.e., 0.1 to 6.5, the in-plain uniformity of thus obtained W film can be improved thereby to achieve the second invention.

In general, in case of the magnetron sputtering method, a surface condition of the W sputtering target is hardly changed at early stage of the sputtering operation. However, when the sputtering operation is advanced, only a portion formed with a strong magnetic field is greatly consumed while forming a specified slant angle. As a result, so called, a most eroded portion is formed.

In this case, a shape of the sputtered surface of the target is changed when the sputtering operation is further advanced from an initial stage of the sputtering, so that the releasing angle distribution of the sputtered grains is also greatly changed. When the crystal orientation ratio is outside the above range, the influence of the change in shape of the target surface on the releasing angle distribution of the sputtered grains has a more significant impact than that of the change in crystal orientation, so that the crystal orientation ratio (110)/(200) is specified to a range of 0.1-6.5. The preferable range of this crystal orientation ratio is 1-5, and more preferably be a range of 2-4.

Further, when the dispersion of this crystal orientation ratio is too large in entire W sputtering target, an evenness in the releasing angle distribution would occur and a difference in thickness of thus formed W film is enlarged, so that the dispersion of this crystal orientation ratio is preferably be set to 50% or less. The more preferable range of this dispersion is 30% or less, and the most preferable range is 15% or less.

Next, the tungsten sputtering target according to a third invention is characterized in that a crystal orientation ratio (211)/{(110)+(200)+(211)+(220) +(310)} is 0.17 or less when peak intensities of a crystal plane (110), a crystal plane (200), a crystal plane (211), a crystal plane (220) and a crystal plane (310) of a surface of the target to be sputtered are analyzed by X-ray diffraction.

As described hereinbefore, when the sputtering operation is continued, this slip plane (slip belt) of the W sputtering target is formed with fault-shaped concavo-convex. The ups and downs of this concavo-convex is further greatened when the sputtering operation is further continued. The inventors of this invention had found the following findings. That is, when the ups and downs of this concavo-convex are further increased, the electrical charge is concentrated at the convex portion of this concavo-convex thereby to cause the abnormal discharge. As the results of the reviewing the slip, the inventors of this invention had found that when a crystal orientation ratio (211)/{(110)+(200)+(211)+(220)+(310)} obtained when peak intensities of crystal planes (110), (200), (211), (220) and (310) of a surface of the target to be sputtered are analyzed by X-ray diffraction is set to a specified range, i.e., 0.17 or less, the amount of the particles to be mixed in the W film can be effectively decreased. More particularly, the amount of particles each having a diameter of 1 μm or less can be significantly reduced.

In this regard, when the above crystal orientation ratio is excessively large, the ups and downs of this concavo-convex formed at the slip plane is further greatened thereby to form a large convex portion. Then, electrical charge is concentrated to the convex portion and the abnormal discharge is liable to occur thereby to increase the amount of the particles. Therefore, the crystal orientation ratio (211)/{(110)+(200)+(211)+ (220)+(310)} is set to 0.17 or less. The more preferable range of this crystal orientation ratio is 0.15 or less, and the most preferable range is 0.1 or less.

Further, when the dispersion of this crystal orientation ratio is too large in entire W sputtering target, an evenness in the releasing angle distribution would occur and a difference in thickness of thus formed W film is enlarged, so that the dispersion of this crystal orientation ratio is preferably be set to 30% or less. The more preferable range of this dispersion is 15% or less, and the most preferable range is 10% or less.

In this connection, the half band width, crystal orientation ratio of the crystal planes and dispersion thereof specified in the present invention are defined as values which are measured by the following methods.

Figure 1:
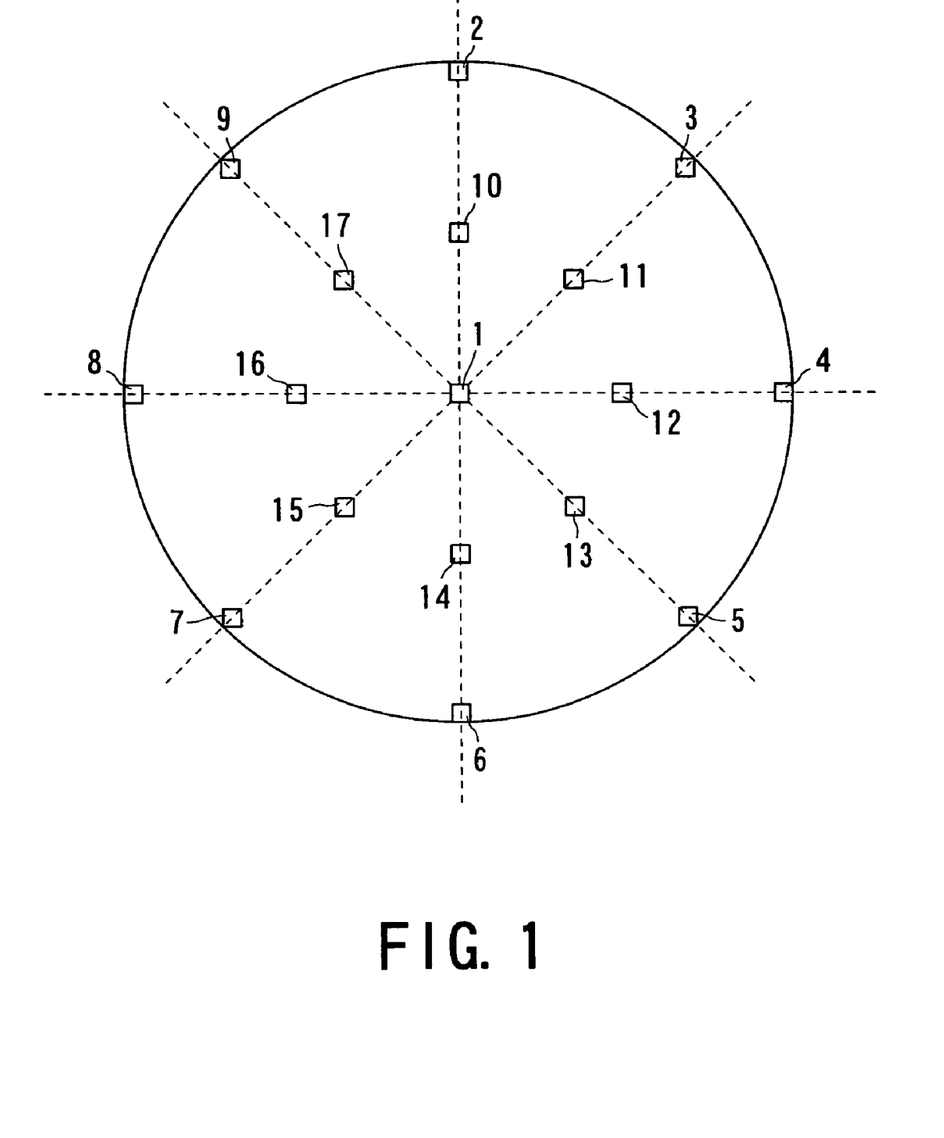
FIG. 1 is a schematic plan view showing sampling points at which test pieces are sampled for measuring a half band width and dispersion of the half band widths of the target according to the present invention

That is, as shown in FIG. 1, 17 pieces of test pieces are sampled from entire sampling positions of a circular disk-shaped target. The sampling positions consist of: a center portion (position 1) of the target; outer peripheral 8 portions (positions 2-9) located on four straight lines each passing through the center portion and equally dividing a circumference of the target, each peripheral portion is located at a distance 90% of a radius from the center portion; and intermediate 8 portions (positions 10-17) each intermediate position is located at a distance 50% of a radius from the center portion. Each test piece has a size of 15 mm×15 mm. X ray diffraction peak and crystal orientation are measured with respect to each of the 17 test pieces, and averaged values are adopted as the diffraction peak and crystal orientation. The half band width is calculated from a diffraction peak of the respective crystal planes obtained by X-ray diffraction. This half band width is a ratio of a peak width at half height of the peak and a peak height. A representing value is obtained by averaging at least ten measured data with respect to one measuring point. Further, the crystal orientation is given as a peak intensity obtained by X-ray diffraction. As an X-ray diffraction system, an X-ray diffraction apparatus manufactured by Rigaku Co. Ltd. was used. The measuring conditions are as follows.

X-ray: Cu, k-α1, 50 kV, 100 mA, vertical type goniometer,
Divergent slit: 1 deg,
Dispersion slit: 0.15 mm,
Scanning mode: continuous
Scan speed: 1°/min,
Scan step: 0.01°, Scanning axis 2 θ/θ
Measuring angle: 38°~42°

In this connection, as a chart for measuring the half band width of X-ray diffraction, a standard chart provided with a scale length of 11 mm corresponding to an X-ray intensity of 10000 cps and provided with a scale length of 23 mm corresponding to a scanning angle of 1°. In a case where this standard chart is not available, the half band width is measured on the basis of a chart modified so as to meet the standard.

Further, the dispersion of the peak intensities of the crystal planes for entire surface of the target is a value obtained from a maximum value and a minimum value of the peak intensities of the respective crystal planes measured for 17 test pieces. The value of the dispersion is calculated on the basis of the following equation.

Dispersion (%)={(maximum value−minimum value)/(maximum value+minimum value)}×100

In the above tungsten (W) sputtering target, it is preferable that the tungsten sputtering target has a relative density of 99% or more.

When the relative density of the target is excessively low, the amount of particle generation will disadvantageously increases. The preferable relative density of the target is 99.5% or more, furthermore preferably be 99.7% or more. The relative density of the target is a value measured by means of Archimedes' method.

The W sputtering target of the present invention is permissible to contain a small amount of impurity as far as the impurity content is similar to that of a sputtering target composed of a normal metal material having a high purity. However, when the impurity amount is excessively large, there may be posed a fear that a leak current is increased and a specific resistance is increased thereby to lower the characteristic of the W film.

Accordingly, it is preferable that the tungsten sputtering target according to the present invention is constituted by a high purity W material in which a total amount of iron (Fe), nickel (Ni), chromium (Cr), copper (Cu), aluminum (Al), sodium (Na), potassium (K), uranium (U) and thorium (Th) as impurities contained in the material is 100 ppm or less.

In other words, it is preferable to use a high purity W material such that the purity value [100−(Fe+Ni+Cr+Cu+Al+Na+K+U+Th)] obtained by subtracting the total content (mass %) of Fe, Ni, Cr, Cu, Al, Na, K, U, Th from 100% is 99.99% or more.

It is preferable that the tungsten sputtering target according to the present invention is used after being integrally bonded to a backing plate composed of Cu, Al or alloy thereof. As a bonding method for bonding to the backing plate, conventionally well known bonding methods such as diffusion bonding method or brazing method can be applied.

The tungsten sputtering target according to the present invention can be manufactured in accordance with, for example, the following method.

For example, as a first method, there is a method using a hot pressing apparatus. At first, high purity W powder is pulverized by means of a ball mill thereby to obtain a fine and high purity W powder containing less deformed particles. This high purity W powder is packed in a carbon mold die of which size is controlled to a size of the aimed target, and then the W powder is pressed and sintered by the hot pressing apparatus. The high purity W powder containing a great amount of the deformed particles would not be sufficiently sintered to internal portion even if high pressure and temperature are applied to the molded body. Therefore, it is preferable to use a W powder containing the deformed particles as little as possible.

In the above pressing and sintering step, prior to attain a maximum sintering temperature, it is preferable to carry out a degassing treatment for heating the molded body to a temperature of 1150° C.~1450° C. for at least one hour. This treatment is for removing an adsorbed oxygen adhered to the material powder and impurity elements contained in the material powder. A preferable environment for the degassing treatment is vacuum (1 Pa or lower) or $H_2$ gas atmosphere.

After completion of the degassing treatment, the molded body is heated and sintered at a predetermined intermediate sintering temperature while being applied with a pressure of 20 MPa or higher under a vacuum of 1 Pa or lower.

In this regard, prior to attain the intermediate sintering temperature, it is preferable to heat the molded body at a heating speed of 2-5° C./min and hold the molded body at the intermediate sintering temperature of 1450-1700° C. for one hour or longer.

By conducting the intermediate sintering step, a uniformity in temperature of a sintered body can be improved, and pores and voids included in the sintered body can be also effectively removed. Further, due to this intermediate sintering step, the dispersion of the half band width of the crystal plane (110) can be controlled to within a range specified in the present invention.

Next, after completion of the intermediate sintering step, the sintered body is heated to the maximum sintering temperature to conduct a final sintering operation. The maximum sintering temperature is preferably set to 1900° C. or higher. A retention time (holding time) at the maximum sintering temperature is preferably set to 5 hours or longer.

As a cooling operation after the final sintering step, for example, it is preferable to release the pressure applied to the sintered body and then cool the sintered body at a cooling speed of 10° C./min or more. Further, the press-sintered body may be further subjected to a hot isostatic pressing (HIP) treatment. It is preferable to set the temperature for HIP treatment to 1400-1800° C., and set the pressure to 150 MPa or higher. By conducting such HIP treatment, it becomes possible to obtain a denser sintered body.

In this connection, when the above sintered body is subjected to a heat treatment so as to be heated to temperature of 1000-1300° C. in a vacuum or hydrogen ($H_2$) gas atmosphere for at least one hour, the half band width becomes small and a W sputtering target having a preferable half band width can be easily obtained, thus being preferable to conduct the heat treatment.

As another manufacturing method, after the material powder is subjected to a cold isostatic pressing (CIP) treatment, the molded body is subjected to HIP treatment, followed by hydrogen-sintered, then the resultant sintered body may be subjected to a hot rolling or hot forging.

As still another manufacturing method, after completion of the above hot pressing (HP) or hot isostatic pressing (HIP), the sintered body may be further subjected to the hydrogen-sintering treatment, thereafter, the hot forging and the hot rolling may be carried out to the sintered body.

As yet another manufacturing method, the target may be manufactured in accordance with a CVD (chemical vapor deposition) method using $WF_6/H_2$ gas or the like. The target may also be manufactured in accordance with a sputtering method, an ion plating method, a flame spray coating method or a vacuum evaporation method.

Thus obtained target material (sintered body) is machine-worked thereby to form into a predetermined shape of a target.

Next, thus obtained target material is subjected to the following surface finishing treatment, so that there can be obtained a target of which half band width of the crystal plane (110) of a surface to be sputtered is within the range specified in this invention.

At first, in the present invention, the surface of the target to be sputtered is subjected to at least one of rotary grinding and polishing. In particular, it is preferable to conduct the rotary grinding thereafter to conduct the polishing. In this case, a surface roughness of the target is preferably set to 1 μm or less in terms of arithmetic average roughness (Ra).

In the present invention, after conducting the above grinding work, a surface treatment such as a wet or dry etching or a reverse sputtering method or the like is carried out to the sintered body. In this case, the surface roughness is preferably set to 0.5 μm or less in terms of arithmetic average roughness (Ra). As an etching solution used for the wet-etching process, it is possible to use potassium ferricyanide (red prussiate) or the like. As an etching gas used for dry etching process, it is possible to use $CF_4/O_2$ mixed gas or the like.

In the present invention, by conducting the above finishing work, it becomes possible to remove the internal distortion accumulated at the crystal planes due to the mechanical work for the target material, and possible to set the half band Width to within a range specified in the present invention.

Next, as a method of manufacturing a W sputtering target of the second invention in which a crystal orientation ratio (110)/(200) is specified, a method using a hot press will be explained hereunder.

At first, high purity W powder is pulverized in argon (Ar) gas atmosphere or hydrogen gas atmosphere for 24 hours or longer by means of a ball mill thereby to obtain a fine and high purity W powder containing less deformed particles.

This high purity W powder is packed in a carbon mold die of which size is controlled to a size of the aimed target, and then the W powder is pressed and sintered by the hot pressing apparatus. The high purity W powder containing a great amount of the deformed particles would not be sufficiently sintered to internal portion even if high pressure and temperature are applied to the molded body. Therefore, it is preferable to use a W powder containing the deformed particles as little as possible. Further, it is preferable to use a W powder having an oxygen content of 2000 ppm or less. This is because, when the oxygen content is large, the W powder would not be sufficiently sintered to internal portion, so that a sintered body having a predetermined density cannot be obtained.

In the above pressing and sintering step, prior to attain a maximum sintering temperature, it is preferable to carry out a degassing treatment for heating the molded body to a temperature of 1150° C.~1450° C. for at least one hour. This treatment is for removing an adsorbed oxygen adhered to the material powder and impurity elements contained in the material powder. A preferable environment for the degassing treatment is vacuum (1 Pa or lower) or $H_2$ gas atmosphere.

After completion of the above degassing treatment, an intermediate sintering is performed so that the molded body is heated and sintered at a predetermined intermediate sintering temperature while being applied with a pressure of 20 MPa or higher under a vacuum of 1 Pa or lower.

In this step, it is preferable to repeat a depressing-pressing cycle at least 5 times, the cycle comprising the steps of: releasing a pressure when the atmosphere attains to a predetermined pressure for the intermediate sintering; and again applying the pressure to the molded body. This pressuring-depressing-pressuring cycle makes it possible to improve the density of the sintered body at the intermediate sintering step and to control a direction of the crystal orientation aimed by the present second invention.

In this regard, prior to attain to the intermediate sintering temperature, it is preferable to heat the molded body at a heating speed of 2-5° C./min and hold the molded body at the intermediate sintering temperature of 1450-1700° C. for one hour or longer. By conducting the intermediate sintering step, a uniformity in temperature of a sintered body can be improved, and pores and voids included in the sintered body can be also effectively removed. Further, due to this intermediate sintering step, the dispersion of the crystal orientation ratio (110)/(200) can be controlled to within a range specified in the present invention.

Next, after completion of the intermediate sintering step, the sintered body is heated to the maximum sintering temperature to conduct a final sintering operation. The maximum sintering temperature is preferably set to 1900° C. or higher. A retention time (holding time) at the maximum sintering temperature is preferably set to 5 hours or longer.

As a cooling operation after the final sintering step, for example, it is preferable to release the pressure applied to the sintered body and then cool the sintered body at a cooling speed of 10° C./min or more. Further, the press-sintered body may be further subjected to a hot isostatic pressing (HIP) treatment. It is preferable to set the temperature for HIP treatment to 1400-1800° C., and set the pressure to 150 MPa or higher. By conducting such HIP treatment, it becomes possible to obtain a denser sintered body.

In this connection, when the above sintered body is further subjected to a hot working or a heat treatment so as to be heated to temperature of 2000° C. or higher in a hydrogen ($H_2$) gas atmosphere, a W sputtering target having the dispersion of the crystal orientation ratio (110)/(200) specified in this invention can be easily obtained, thus being preferable to conduct the hot working or the heat treatment.

In this connection, the hot working means a hot forging or a hot rolling or the like. As the condition of the hot working, it is preferable that the sintered body is heated to 1000-1400° C. in hydrogen ($H_2$) gas atmosphere and held in this state for at least one hour, followed by being worked at a working ratio of 30% or less.

As another manufacturing method, after the material powder is subjected to a cold isostatic pressing (CIP) treatment, the molded body is subjected to HIP treatment, followed by hydrogen-sintered, then the resultant sintered body may be subjected to a hot rolling or hot forging. As another manufacturing method, the HIP treatment can be also solely used.

As still another manufacturing method, after completion of the above hot pressing (HP) or hot isostatic pressing (HIP), the sintered body may be further subjected to the hydrogen-sintering treatment, thereafter, the hot forging and the hot rolling may be carried out to the sintered body.

Next, as a method of manufacturing a W sputtering target of the second invention in which a crystal orientation ratio (211)/{(110)+(200)+(211)+(220)+(310)} is specified, a method using a hot press will be explained hereunder.

At first, high purity W powder is pulverized in argon (Ar) gas atmosphere or hydrogen gas atmosphere for 24 hours or longer by means of a ball mill thereby to obtain a fine and high purity W powder containing less deformed particles.

This high purity W powder is packed in a carbon mold die of which size is controlled to a size of the aimed target, and then the W powder is pressed and sintered by the hot pressing apparatus. The high purity W powder containing a great amount of the deformed particles would not be sufficiently sintered to internal portion even if high pressure and temperature are applied to the molded body. Therefore, it is preferable to use a W powder containing the deformed particles as little as possible. Further, it is preferable to use a W powder having an oxygen content of 2000 ppm or less. This is because, when the oxygen content is large, the W powder would not be sufficiently sintered to internal portion, so that a sintered body having a predetermined density cannot be obtained.

In the above pressing and sintering step, prior to attain a maximum sintering temperature, it is preferable to carry out a degassing treatment for heating the molded body to a temperature of 1150° C.~1450° C. for at least one hour. This treatment is for removing an adsorbed oxygen adhered to the material powder and impurity elements contained in the material powder. A preferable environment for the degassing treatment is vacuum (1 Pa or lower) or $H_2$ gas atmosphere.

After completion of the above degassing treatment, an intermediate sintering is performed so that the molded body is heated and sintered at a predetermined intermediate sintering temperature while being applied with a pressure of 20 MPa or higher under a vacuum of 1 Pa or lower. This is because, when the applying pressure is excessively large, it is difficult to obtain a W sputtering target having a high density.

In this step, it is preferable to repeat a depressing-pressing cycle at least 5 times, the cycle comprising the steps of: releasing a pressure when the atmosphere attains to a predetermined pressure for the intermediate sintering; and again applying the pressure to the molded body. This pressuring-depressing-pressuring cycle makes it possible to improve the density of the sintered body at the intermediate sintering step and to control a direction of the crystal orientation aimed by the present third invention.

In this regard, prior to attain to the intermediate sintering temperature, it is preferable to heat the molded body at a heating speed of 2-5° C./min and hold the molded body at the intermediate sintering temperature of 1450-1700° C. for one hour or longer.

By conducting the intermediate sintering step, a uniformity in temperature of a sintered body can be improved, and pores and voids included in the sintered body can be also effectively removed.

Subsequently, after conducting the above intermediate sintering step, the temperature is once lowered to 800-1000° C. Then, a high pressure of 4 MPa or higher is applied to the sintered body at a pressurizing speed of 1 MPa/min (10 ton/min) or more and heated to a maximum sintering temperature thereby to carry out the final sintering. In this regard, when the temperature to be once lowered is excessively low, the sintered body is liable to cause cracks due to the subsequent abrupt pressurization. On the other hand, when the temperature to be once lowered is excessively high, the releasing of the distortions contained in the sintered body becomes remarkable, so that it becomes impossible to obtain the predetermined crystal orientation ratio. In this regard, the abrupt pressurization in which a high pressure is abruptly applied to the sintered body at the stage of having advanced the sintering in the intermediate sintering step (for example, the sintered density is 95% or more) is performed for the purpose of promoting a slipping effect thereby to obtain a predetermined crystal orientation ratio.

After completion of this intermediate sintering step, the sintered body is heated to the maximum sintering temperature to conduct a final sintering operation. The maximum sintering temperature is preferably set to 1900° C. or higher. A retention time (holding time) at the maximum sintering temperature is preferably set to 5 hours or longer. This is because, when the maximum sintering temperature is excessively lowered or the sintering time is excessively short, it is impossible to obtain a sintered body having a predetermined density and the crystal orientation ratio.

As a cooling operation after the final sintering step, for example, it is preferable to release the pressure applied to the sintered body and then cool the sintered body at a cooling speed of 10° C./min or more. Further, the press-sintered body may be further subjected to a hot isostatic pressing (HIP) treatment. It is preferable to set the temperature for HIP treatment to 1400-1800° C., and set the pressure to 150 MPa or higher. By conducting such HIP treatment, it becomes possible to obtain a denser sintered body.

Next, a tungsten (W) sputtering target according to the present fourth invention in which a crystal orientation ratio (110)/(200) is 0.1-6.5 and a crystal orientation ratio (211)/{(110)+(200)+(211)+(220)+(310)} is 0.17 or less when peak intensities of a crystal plane (110), a crystal plane (200), a crystal plane (211), a crystal plane (220) and a crystal plane (310) of a surface of the target to be sputtered are analyzed by X-ray diffraction, can be manufactured by appropriately select the manufacturing methods described above.

Next, thus obtained target material is subjected to the surface finishing treatment. It is preferable that the tungsten sputtering target of which surface is finished according to the present invention is used after being integrally bonded to a backing plate composed of Cu, Al or alloy thereof. As a bonding method for bonding to the backing plate, conventionally well known bonding methods such as diffusion bonding method or brazing method can be applied.

It is preferable to carry out the brazing method by utilizing well known In type or Sn type brazing materials. In a case where the target is bonded to a backing plate composed of aluminum (Al), it is preferable that the temperature at the diffusion bonding is set to 600° C. or lower. This is because, a melting point of Al is 660° C.

In accordance with the above manufacturing method, it becomes possible to obtain the high purity W sputtering target of the present invention.

In this regard, the above described methods is merely one example of the method for obtaining the W sputtering target of the present invention, and the method is not limited thereto as far as the method can manufacture the W sputtering target of the present invention.

The W sputtering target of the present invention is used for forming the electrodes and/or wirings of the electronic parts represented by semiconductor element and liquid crystal display elements.

EMBODIMENTS

Next, concrete embodiments of the present invention will be explained with reference to the following Examples and Comparative Examples.

Example 1

High purity W powders were prepared, and each of these high purity W powders was packed in a carbon mold die and the mold die was set into a hot pressing apparatus. Then, each of the packed W powders was heated to a temperature of 1250° C. and held for 3 hours under a vacuum atmosphere of 1 Pa or lower thereby to perform a degassing treatment.

Subsequently, an intermediate sintering was performed under the conditions shown in columns of the intermediate sintering step of Table 1. That is, each of the degassed molded bodies was heated from the degassing temperature to the intermediate sintering temperature at heating speed shown in Table 1 while being applied with a pressure of 30 MPa under a vacuum atmosphere of 1 Pa or lower, and held at the temperature for the holding time shown in Table 1, thereby to perform the intermediate sintering step.

After the above intermediate sintering step, the sintered body was held at a temperature of 1900° C. for 5 hours, thereby to prepare a W sintered body as a target material. A cooling operation after the sintering was performed by substituting Ar gas for the atmosphere, and a cooling speed was 10° C./min.

Thus prepared W sintered body was then machine-worked so as to provide a size of the aimed target (diameter: 300 mm×thickness: 5 mm). After the surface of the target was subjected to a rotary grinding, a finishing work shown in Table 1 was performed. Thus obtained sputtering target was integrally bonded to a backing plate composed of Cu using an In type brazing material, whereby a several kinds of W sputtering targets were obtained.

Crystal planes of the surface of the respective W sputtering targets were analyzed by means of X-ray diffraction apparatus (XRD manufactured by RIKEN), thereby to measure the half band width of a peak corresponding to the crystal plane (110) and a dispersion of the half band width. The measured results are shown in Table 1.

In table 1, the targets of No. 14-16 were subjected to a heat treatment so that the W sintered body was heated to 1200° C. and held at the temperature for 2 hours.

In this connection, an impurity content (a total amount of Fe, Ni, Cr, Cu, Al, Na, K, U and Th) contained in the respective targets was 10 ppm or less.

Using each of thus manufactured W sputtering targets, a sputtering operation was performed under the following conditions:
Sputtering type: magnetron sputtering,
Back pressure; $1\times10^{-5}$ Pa,
Output power DC; 2 kW,
Ar; 0.5 Pa
Sputtering time; 5 min, thereby to form a W film on a 8-inch Si wafer. In order to measure a uniformity in thickness of the W film, the film thickness was measured with respect to points on a diameter line at interval of 5 mm from a peripheral portion of the Si wafer substrate. From a maximum value and a minimum value of the measured thickness data, the uniformity in thickness was calculated on the basis of the following equation.

Uniformity in Film Thickness (%)={(maximum value−minimum value)/(maximum value+minimum value)}×100

These results are shown in Table 1 in conjunction with the former conditions.

TABLE 1

| | | Intermediate Sintering Step | | | | | Dispersion of | Uniformity |
|---|---|---|---|---|---|---|---|---|
| | No. | Heating Speed (° C./min) | Temp. (° C.) | Holding Time (h) | Finishing Work | (110)Half Band Width | (110)Half Band Width (%) | in Film Thickness (%) |
| Examples | 1 | 2 | 1400 | 1.5 | Polishing with diamond abrasive grain | 0.3288 | 28.1 | 0.98 |
| | 2 | 3 | 1550 | 5 | Polishing with G.C. grind stone | 0.2998 | 25.2 | 0.94 |
| | 3 | 2 | 1450 | 1.5 | Polishing with diamond abrasive grain and Etching with red prussiate sol. for 1 min. | 0.1919 | 26.26 | 0.92 |
| | 4 | 2.5 | 1450 | 2 | Polishing with diamond abrasive grain and Etching with red prussiate sol. for 3 min. | 0.1628 | 24.1 | 0.86 |
| | 5 | 4 | 1550 | 5 | Polishing with diamond abrasive grain and Etching with red prussiate sol. for 5 min. | 0.1331 | 20.5 | 0.75 |
| | 6 | 4 | 1600 | 5 | Polishing with diamond abrasive grain and Etching with red prussiate sol. for 10 min. | 0.1006 | 14.3 | 0.68 |
| | 7 | 3 | 1550 | 3 | Polishing with G.C. grind stone and Etching with red prussiate sol. for 1 min. | 0.1714 | 24.9 | 0.90 |
| | 8 | 4 | 1550 | 1.5 | Polishing with G.C. grind stone and Etching with red prussiate sol. for 3 min. | 0.1314 | 22.3 | 0.85 |
| | 9 | 3 | 1600 | 7 | Polishing with G.C. grind stone and Etching with red prussiate sol. for 5 min. | 0.1184 | 15.6 | 0.79 |
| | 10 | 5 | 1650 | 5 | Polishing with G.C. grind stone and Etching with red prussiate sol. for 10 min. | 0.0921 | 10.5 | 0.74 |
| | 11 | 2.5 | 1450 | 1.5 | Polishing with diamond abrasive grain and Dry Etching with $CF_4/O_2$ mixed gas for 3 min. | 0.1442 | 28.8 | 0.88 |
| | 12 | 3 | 1550 | 8 | Polishing with diamond abrasive grain and Dry Etching with $CF_4/O_2$ mixed gas for 5 min. | 0.1277 | 20.2 | 0.76 |
| | 13 | 4 | 1650 | 6 | Polishing with diamond abrasive grain and Dry Etching with $CF_4/O_2$ mixed gas for 10 min. | 0.0876 | 12.4 | 0.65 |
| | 14 | 2.5 | 1450 | 2 | Polishing with diamond abrasive grain and Reverse-Sputter Etching with Ar gas for 1 min. | 0.2212 | 21.2 | 0.89 |

TABLE 1-continued

|  | No. | Intermediate Sintering Step | | | Finishing Work | (110)Half Band Width | Dispersion of (110)Half Band Width (%) | Uniformity in Film Thickness (%) |
|---|---|---|---|---|---|---|---|---|
|  |  | Heating Speed (° C./min) | Temp. (° C.) | Holding Time (h) | | | | |
|  | 15 | 3 | 1550 | 3 | Polishing with diamond abrasive grain and Reverse-Sputter Etching with Ar gas for 3 min. | 0.1435 | 17.7 | 0.84 |
|  | 16 | 3.5 | 1650 | 2 | Polishing with diamond abrasive grain and Reverse-Sputter Etching with Ar gas for 5 min. | 0.0957 | 14.3 | 0.71 |
|  | 17 | 10 | 1600 | 4 | Polishing with diamond abrasive grain and Etching with red prussiate sol. for 5 min. | 0.2882 | 45.6 | 1.58 |
|  | 18 | 10 | 800 | 8 | Polishing with G.C. grind stone and Etching with red prussiate sol. for 10 min. | 0.3114 | 50.4 | 1.66 |
| Comparative Examples | 19 | 20 | 900 | 0.5 | None | 0.4429 | 36.6 | 3.33 |
|  | 20 | 10 | 1000 | 0.1 | Lathe Work | 0.5622 | 38.5 | 3.22 |
|  | 21 | 8 | 1900 | 2 | Rotary grinding and Dry Etching with $CF_4/O_2$ mixed gas for 3 min | 0.4233 | 37.9 | 3.66 |
|  | 22 | 7 | 1000 | 0.2 | Rotary grinding and Dry Etching with $CF_4/O_2$ mixed gas for 5 min | 0.4098 | 35.3 | 3.28 |
|  | 23 | 10 | 1500 | 0.5 | Rotary grinding and Dry Etching with $CF_4/O_2$ mixed gas for 10 min | 0.3942 | 31.5 | 3.24 |
|  | 24 | 1 | 600 | 1.5 | Rotary grinding and and Reverse-Sputter Etching with Ar gas for 1 min. | 0.4759 | 40.6 | 3.84 |
|  | 25 | 30 | 1300 | 15 | Rotary grinding and Reverse-Sputter Etching with Ar gas for 3 min. | 0.4422 | 36.8 | 3.41 |
|  | 26 | 7 | 1400 | 3 | Rotary grinding and Reverse-Sputter Etching with Ar gas for 5 min. | 0.4063 | 32.4 | 3.25 |
|  | 27 | 3 | 1500 | 4 | Rotary grinding and Dry Etching with $CF_4/O_2$ mixed gas for 5 min | 0.4225 | 20.6 | 3.66 |
|  | 28 | 5 | 1600 | 10 | Rotary grinding and and Reverse-Sputter Etching with Ar gas for 1 min. | 0.3988 | 22.3 | 3.34 |

As is clear from the results shown in Table 1, the W sputtering targets in which the half band width of a peak corresponding to the crystal plane (110) and a dispersion of the half band width of peak analyzed by X-ray diffraction of a surface to be sputtered are controlled to be within the range specified by this invention can provide an excellent uniformity in thickness of the W film in comparison with Comparative Examples.

Example 2

High purity W powders were prepared, and each of these high purity W powders was packed in a carbon mold die and the mold die was set into a hot pressing apparatus. Subsequently, an intermediate sintering was performed under the conditions shown in columns of the intermediate sintering step of Table 2. That is, each of the packed W powders was heated to the intermediate sintering temperature at heating speed shown in Table 2, and held at the temperature for the holding time shown in Table 2, thereby to perform the intermediate sintering step. After the above intermediate sintering step, the sintered body was held at a maximum sintering temperature of 1900° C. for 5 hours while being applied with a pressure of 30 MPa under a vacuum atmosphere of 1 Pa or lower, thereby to prepare a W sintered body. Thereafter, this W sintered body was subjected to a HIP treatment such that the sintered body was heated to 1800° C. and held for 5 hours while being applied with a pressure of 180 MPa, thereby to prepare a W sintered body as a target material.

Thus prepared W sintered body was then machine-worked so as to provide a size of the aimed target (diameter: 300 mm×thickness: 5 mm). After the surface of the target was subjected to a rotary grinding, a finishing work shown in Table 2 was performed. Thus obtained sputtering target was integrally bonded to a backing plate composed of Cu using an In type brazing material, whereby a several kinds of W sputtering targets were obtained.

Under the same conditions as in Example 1, crystal planes of the surface of the respective W sputtering targets were analyzed by means of X-ray diffraction apparatus, thereby to measure the half band width of a peak corresponding to the crystal plane (110) and a dispersion of the half band width. The measured results are shown in Table 2.

In this connection, an impurity content (a total amount of Fe, Ni, Cr, Cu, Al, Na, K, U and Th) contained in the respective targets was 10 ppm or less.

Using each of thus manufactured W sputtering targets, a sputtering operation was performed under the same conditions as in Example 1, thereby to form a W film on a 8-inch Si wafer. With respect to thus formed W film, a uniformity in thickness of the W film was measured. These results are shown in Table 2 in conjunction with the former conditions.

TABLE 2

|  | No. | Intermediate Sintering Step | | | Finishing Work | (110)Half Band Width | Dispersion of (110)Half Band Width (%) | Uniformity in Film Thickness (%) |
|---|---|---|---|---|---|---|---|---|
|  |  | Heating Speed (° C./min) | Temp. (° C.) | Holding Time (h) | | | | |
| Examples | 29 | 3 | 1500 | 2 | Polishing with diamond abrasive grain | 0.2955 | 27.7 | 0.91 |
|  | 30 | 4 | 1450 | 5 | Polishing with G.C. grind stone | 0.2665 | 28.1 | 0.89 |

TABLE 2-continued

|  | No. | Intermediate Sintering Step | | | Finishing Work | (110)Half Band Width | Dispersion of (110)Half Band Width (%) | Uniformity in Film Thickness (%) |
|---|---|---|---|---|---|---|---|---|
|  |  | Heating Speed (° C./min) | Temp. (° C.) | Holding Time (h) |  |  |  |  |
|  | 31 | 2.5 | 1600 | 3 | Polishing with diamond abrasive grain and Etching with red prussiate sol. for 3 min. | 0.1313 | 20.3 | 0.84 |
|  | 32 | 4.5 | 1400 | 6 | Polishing with diamond abrasive grain and Etching with red prussiate sol. for 20 min. | 0.1111 | 11.3 | 0.51 |
|  | 33 | 1 | 1400 | 5 | Polishing with G.C. grind stone | 0.2244 | 41.1 | 1.38 |
|  | 34 | 3 | 800 | 2 | Polishing with diamond abrasive grain and Etching with red prussiate sol. for 20 min. | 0.2386 | 46.9 | 1.56 |
| Comparative Examples | 35 | 10 | 1000 | 0.5 | None | 0.4488 | 38.2 | 3.41 |
|  | 36 | 0.5 | 1400 | 7 | Rotary grinding and Etching with red prussiate sol. for 3 min. | 0.3925 | 36.6 | 3.99 |
|  | 37 | 3 | 900 | 2 | Rotary grinding and Etching with red prussiate sol. for 20 min. | 0.3587 | 33.3 | 3.74 |
|  | 38 | 2.5 | 1300 | 4 | None | 0.4266 | 20.6 | 4.21 |
|  | 39 | 4 | 1400 | 5 | Rotary grinding and Etching with red prussiate sol. for 3 min. | 0.3993 | 22.4 | 4.35 |

As is clear from the results shown in Table 2, the W sputtering targets in which the half band width of a peak corresponding to the crystal plane (110) and a dispersion of the half band width of peak analyzed by X-ray diffraction of a surface to be sputtered are controlled to be within the range specified by this invention can provide an excellent uniformity in thickness of the W film in comparison with Comparative Examples.

Example 3

High purity W powders were prepared, and each of these high purity W powders was subjected to a CIP treatment and followed by being subjected to HIP treatment such that a molded body was heated to 1600° C. and held for 5 hours while being applied with a pressure of 150 MPa, thereby to obtain a W sintered body having a density of 96%. Thereafter, the W sintered body was held in hydrogen gas atmosphere for 10 hours, and subjected to a hot rolling under a temperature of 2200° C. in hydrogen atmosphere, thereby to obtain a W sintered body as a target material.

Thus obtained W sintered body was then machine-worked so as to provide a size of the aimed target (diameter: 300 mm×thickness: 5 mm). After the surface of the target was subjected to a rotary grinding, a finishing work shown in Table 3 was performed. Thus obtained sputtering target was integrally bonded to a backing plate composed of Cu using an In type brazing material, whereby a several kinds of W sputtering targets were obtained.

Under the same conditions as in Example 1, crystal planes of the surface of the respective W sputtering targets were analyzed by means of X-ray diffraction apparatus, thereby to measure the half band width of a peak corresponding to the crystal plane (110) and a dispersion of the half band width. The measured results are shown in Table 3.

In this connection, an impurity content (a total amount of Fe, Ni, Cr, Cu, Al, Na, K, U and Th) contained in the respective targets was 10 ppm or less.

Using each of thus manufactured W sputtering targets, a sputtering operation was performed under the same conditions as in Example 1, thereby to form a W film on a 8-inch Si wafer. With respect to thus formed W film, a uniformity in thickness of the W film was measured. These results are shown in Table 3 in conjunction with the conditions.

TABLE 3

|  | No. | Finishing Work | (110)Half Band Width | Dispersion of (110)Half Band Width (%) | Uniformity in Film Thickness (%) |
|---|---|---|---|---|---|
| Examples | 40 | Polishing with G.C. grind stone and Etching with red prussiate sol. for 3 min. | 0.2116 | 24.4 | 0.94 |
|  | 41 | Polishing with G.C. grind stone and Etching with red prussiate sol. for 20 min. | 0.0577 | 9.3 | 0.62 |
| Comparative Examples | 42 | None | 0.4533 | 34.9 | 3.54 |
|  | 43 | Lathe Work | 0.5551 | 36.1 | 3.85 |
|  | 44 | Lathe Work and Etching with red prussiate sol. For 3 min. | 0.5157 | 38.9 | 4.62 |
|  | 45 | Lathe Work and Etching with red prussiate sol. For 20 min. | 0.4889 | 33.1 | 4.03 |

As is clear from the results shown in Table 3, the W sputtering targets in which the half band width of a peak corresponding to the crystal plane (110) and a dispersion of the half band width of peak analyzed by X-ray diffraction of a surface to be sputtered are controlled to be within the range specified by this invention can provide an excellent uniformity in thickness of the W film in comparison with Comparative Examples.

Example 4

CVD apparatus and material gas comprising $WF_6$ and $H_2$ were used for performing a chemical deposition under a pre-determined condition thereby to obtain a W sintered body.

Thus obtained W sintered body was then machine-worked so as to provide a size of the aimed target (diameter: 300 mm×thickness: 5 mm). After the surface of the target was subjected to a rotary grinding, a finishing work shown in Table 4 was performed. Thus obtained sputtering target was integrally bonded to a backing plate composed of Cu using an In type brazing material, whereby a several kinds of W sputtering targets were obtained.

Under the same conditions as in Example 1, crystal planes of the surface respective W sputtering targets were analyzed by means of X-ray diffraction apparatus, thereby to measure the half band width of a peak corresponding to the crystal plane (110) and a dispersion of the half band width. The measured results are shown in Table 4.

In this connection, an impurity content (a total amount of Fe, Ni, Cr, Cu, Al, Na, K, U and Th) contained in the respective targets was 10 ppm or less.

Using each of thus manufactured W sputtering targets, a sputtering operation was performed under the same conditions as in Example 1, thereby to film on a 8-inch Si wafer. With respect to thus formed W film, a uniformity in thickness of the W film was measured. These results are shown in Table 4 conjunction with the conditions.

of the packed W powders was heated to a temperature shown in Table 5 and held for 3 hours under a vacuum atmosphere of 1 Pa or lower thereby to perform a degassing treatment.

Subsequently, each of the degassed molded bodies was repeatedly subjected to a pressurization-depressurization cycle at a cycle number shown in Table 5. The pressurization-depressurization cycle consists of: pressurizing the molded body to 30 MPa and depressurize it to normal pressure. Thereafter, an intermediate sintering was performed under the conditions shown in columns of the intermediate sintering step of Table 5. That is, each of the degassed molded bodies was heated to the intermediate sintering temperature at heating speed shown in Table 5 while being applied with a pressure of 30 MPa, and held at the temperature for the holding time (2 hours) shown in Table 5, thereby to perform the intermediate sintering step.

After the above intermediate sintering step, the sintered body was heated to a temperature of 1900° C. and held for 5 hours, thereby to perform a final sintering. A cooling operation after the sintering was performed by substituting Ar gas for the atmosphere, and a cooling speed to a normal temperature was set to a value shown in Table 5, thereby to prepare a W sintered body as a target material. As shown in Table 5 as samples of 114-118, a part of the obtained sintered bodies were subjected to a HIP treatment (180 MPa, 1800° C.), a hot forging at a temperature of 1600° C. (working ratio: 20% and 15%) and a hydrogen annealing at a temperature of 1600° C.

TABLE 4

| | No. | Finishing Work | (110)Half Band Width | Dispersion of (110)Half Band Width (%) | Uniformity in Film Thickness (%) |
|---|---|---|---|---|---|
| Examples | 46 | Polishing with diamond abrasive grain and Reverse-Sputter Etching with Ar gas for 3 min. | 0.2998 | 25.2 | 0.93 |
| | 47 | Polishing with diamond abrasive grain and Reverse-Sputter Etching with Ar gas for 15 min. | 0.1115 | 9.88 | 0.54 |
| Comparative | 48 | None | 0.4601 | 36.6 | 3.72 |
| Examples | 49 | Lathe Work | 0.5468 | 40.4 | 4.00 |
| | 50 | Lathe Work and Reverse-Sputter Etching with Ar gas for 3 min. | 0.5233 | 38.8 | 3.86 |
| | 51 | Lathe Work and Reverse-Sputter Etching with Ar gas for 20 min. | 0.5009 | 34.2 | 3.54 |

As is clear from the results shown in Table 4, the W sputtering targets in which the half band width of a peak corresponding to the crystal plane (110) and a dispersion of the half band width of peak analyzed by X-ray diffraction of a surface to be sputtered are controlled to be within the range specified by this invention can provide an excellent uniformity in thickness of the W film in comparison with Comparative Examples.

Next, concrete examples of the present invention in which the crystal orientation ratio is specified will be explained hereunder.

Example 5

High purity W powders were prepared, and each of these high purity W powders was packed in a carbon mold die and the mold die was set into a hot pressing apparatus. Then, each With respect to each of thus obtained W sintered bodies prepared by the respective manufacturing methods, a machine-working was performed so as to provide a size of the aimed target (diameter: 300 mm×thickness: 5 mm). After the surface of the target was subjected to a normal grinding such as a rotary grinding, a finishing work, thus obtained each of the sputtering targets was integrally bonded to a backing plate composed of Cu using an In-type brazing material, whereby a several kinds of W sputtering targets (samples 101-118) were obtained.

In this connection, an impurity content (a total amount of Fe, Ni, Cr, Cu, Al, Na, K, U and Th) contained in the respective targets was 10 ppm or less.

TABLE 5

| Sample | Degassing Pressure (Pa) | Degassing Atmos. | Degassing Temp. (°C.) | Degassing Holding Time (hr) | Pressure (MPa) | Cycle of Pressurization (Cycle) | Heating Speed (°C./min) | Intermediate Sintering Temperature (°C.) | Intermediate Sintering Holding Time (hr) | Final Sintering Temp. (°C.) | Final Sintering Holding Time (hr) | Cooling Atmos. | Cooling Speed (°C./min) | Post Treatment |
|---|---|---|---|---|---|---|---|---|---|---|---|---|---|---|
| 101 | ≦1 | Vacuum | 300 | 3 | 30 | 1 | 2 | 1650 | 2 | 1900 | 5 | Ar | 15 | None |
| 102 | ≦1 | Vacuum | 600 | 3 | 30 | 2 | 2 | 1650 | 2 | 1900 | 5 | Ar | 15 | None |
| 103 | ≦1 | Vacuum | 750 | 3 | 30 | 3 | 2 | 1650 | 2 | 1900 | 5 | Ar | 15 | None |
| 104 | ≦1 | Vacuum | 900 | 3 | 30 | 4 | 2 | 1650 | 2 | 1900 | 5 | Ar | 15 | None |
| 105 | ≦1 | Vacuum | 1000 | 3 | 30 | 4 | 2 | 1650 | 2 | 1900 | 5 | Ar | 15 | None |
| 106 | ≦1 | Vacuum | 1200 | 3 | 30 | 5 | 2 | 1650 | 2 | 1900 | 5 | Ar | 15 | None |
| 107 | ≦1 | Vacuum | 1300 | 3 | 30 | 5 | 2 | 1650 | 2 | 1900 | 5 | Ar | 15 | None |
| 108 | ≦1 | Vacuum | 1400 | 3 | 30 | 7 | 2 | 1650 | 2 | 1900 | 5 | Ar | 15 | None |
| 109 | ≦1 | Vacuum | 1500 | 3 | 30 | 7 | 2 | 1650 | 2 | 1900 | 5 | Ar | 15 | None |
| 110 | ≦1 | Vacuum | 1600 | 3 | 30 | 2 | 2 | 1650 | 2 | 1900 | 5 | Ar | 15 | None |
| 111 | ≦1 | Vacuum | 1400 | 3 | 30 | 7 | 2 | 1600 | 2 | 1900 | 5 | Ar | 2 | None |
| 112 | ≦1 | Vacuum | 1400 | 3 | 30 | 7 | 2 | 1600 | 2 | 1900 | 5 | Ar | 12 | None |
| 113 | ≦1 | Vacuum | 1400 | 3 | 30 | 7 | 2 | 1600 | 2 | 1900 | 5 | Ar | 20 | None |
| 114 | ≦1 | Vacuum | 1400 | 3 | 30 | 7 | 2 | 1600 | 2 | 1900 | 5 | Ar | 5 | HIP |
| 115 | ≦1 | Vacuum | 1400 | 3 | 30 | 7 | 2 | 1600 | 2 | 1900 | 5 | Ar | 20 | HIP |
| 116 | ≦1 | Vacuum | 1400 | 3 | 30 | 7 | 2 | 1600 | 2 | 1900 | 5 | Ar | 15 | Hot Forging (work ratio 20%) |
| 117 | ≦1 | Vacuum | 1400 | 3 | 30 | 7 | 2 | 1600 | 2 | 1900 | 5 | Ar | 15 | Hot Rolling (work ratio 15%) |
| 118 | ≦1 | Vacuum | 1400 | 3 | 30 | 7 | 2 | 1600 | 2 | 1900 | 5 | Ar | 15 | Hydrogen Annealing |

The relative density of each of thus obtained W sputtering targets was measured. The results are shown in Table 6.

Crystal planes of the surface of the respective W sputtering targets were analyzed by means of X-ray diffraction apparatus (XRD manufactured by RIKEN), thereby to measure the crystal orientation ratio (110)/(200) of peaks corresponding to the crystal planes (110), (200) and a dispersion of the crystal orientation ratio. The measured results are shown in Table 6.

Using each of thus manufactured W sputtering targets, a sputtering operation was performed under the following conditions i.e., sputtering type: magnetron sputtering, back pressure; $1\times10^{-5}$ Pa, output power DC; 2 kW, Ar; 0.5 Pa, sputtering time; 5 min, thereby to form a W film on a 8-inch Si wafer. In order to measure a uniformity in thickness of the W film, the film thickness was measured with respect to points on a diameter line at interval of 5 mm from a peripheral portion of the Si wafer substrate. From a maximum value and a minimum value of the measured thickness data, the uniformity in thickness was calculated on the basis of the following equation.

Uniformity in Film Thickness (%)={(maximum value−minimum value)/(maximum value+minimum value)}×100

These results are shown in Table 6 in conjunction with the other data.

TABLE 6

| Sample | Relative Density (%) | Crystal Orientation Ratio | Dispersion of Crystal Orientation Ratio (%) | Uniformity in Film Thickness |
|---|---|---|---|---|
| 101 | 92.3 | 9.4 | 72.6 | 5.38 |
| 102 | 93.1 | 9.3 | 65.8 | 5.23 |
| 103 | 94.2 | 8.8 | 64.2 | 4.61 |
| 104 | 96.1 | 8.5 | 58.9 | 3.88 |
| 105 | 97.6 | 8.2 | 59.2 | 2.92 |
| 106 | 99.1 | 6.1 | 8.9 | 0.88 |
| 107 | 99.2 | 3.2 | 8.7 | 0.83 |
| 108 | 99.2 | 0.5 | 6.9 | 0.84 |
| 109 | 97.5 | 0.04 | 35.6 | 2.80 |
| 110 | 94.5 | 0.02 | 58.2 | 4.11 |
| 111 | 94.1 | 7.9 | 55.6 | 4.05 |
| 112 | 99.3 | 5.2 | 35.3 | 0.77 |
| 113 | 99.5 | 2.8 | 15.7 | 0.59 |
| 114 | 96.9 | 7.3 | 56.4 | 3.22 |
| 115 | 99.7 | 2.5 | 3.5 | 0.31 |
| 116 | 99.7 | 3.5 | 1.8 | 0.24 |
| 117 | 99.7 | 2.9 | 3.1 | 0.25 |
| 118 | 99.8 | 3.1 | 2.3 | 0.22 |

As clear from the results shown in Table 6, the W sputtering targets in which crystal orientation ratio (110)/(200) of peaks corresponding to the crystal planes (110), (200) and a dispersion of the crystal orientation ratio analyzed by X-ray diffraction of a surface to be sputtered are controlled to be within the range specified by this invention can provide an excellent uniformity in thickness of the W film in comparison with Comparative Examples of which the crystal orientation ratio is outside range of this invention.

Example 6

High purity W powders were prepared, and each of these high purity W powders was pulverized by means of a ball mill under Ar atmosphere for the pulverizing time shown in Table 7. Thus obtained each of the pulverized W powders was packed in a carbon mold die and the mold die was set into a hot pressing apparatus. Then, each of the packed W powders was heated to a temperature shown in Table 7 and held for the holding time shown in Table 7 under a vacuum atmosphere of 1 Pa or lower thereby to perform a degassing treatment.

Subsequently, each of the degassed molded bodies was applied with a pressure of 10 MPa as a first pressurization and heated to an intermediate sintering temperature shown in Table 7 at a heating speed of 2° C./min, and held at the temperature for 2 hours, thereby to perform the intermediate sintering.

After the above intermediate sintering step, each of the sintered bodies was once cooled to a cooling temperature shown in Table 7. Each of the cooled sintered bodies was applied with a pressure shown in Table 7 as a second pressurization, and heated to a final sintering temperature shown in Table 7 at a heating speed of 2° C./min, and held at the final sintering temperature for the holding time shown in Table 7, thereby to perform a final sintering. A cooling operation after the final sintering was performed by substituting Ar gas for the atmosphere, and a cooling speed to a normal temperature was set to a value shown in Table 7, thereby to obtain respective W sintered bodies as target materials.

With respect to each of thus obtained W sintered bodies prepared by the respective manufacturing methods, a machine-working was performed so as to provide a size of the aimed target (diameter: 300 mm×thickness: 5 mm). After the surface of the target was subjected to a normal grinding such as a rotary grinding, a finishing work, thus obtained each of the sputtering targets was integrally bonded to a backing plate composed of Cu using an In-type brazing material, whereby a several kinds of W sputtering targets (samples 119-137) were obtained.

In this connection, an impurity content (a total amount of Fe, Ni, Cr, Cu, Al, Na, K, U and Th) contained in the respective targets was 10 ppm or less.

TABLE 7

| | Pulverizing | | Degassing | | | | 1st Pressurization | | Intermediate Sintering | |
|---|---|---|---|---|---|---|---|---|---|---|
| Sample | Atmos. | Pulverizing Time (hr) | Pressure (Pa) | Atmos. | Temp. (° C.) | Hoding Time (hr) | Pressure (MPa) | Heating Speed (° C./min) | Temp. (° C.) | Hoding Time (hr) |
| 119 | None | | ≦1 | Vacuum | 1000 | 3 | 10 | 2 | 1650 | 2 |
| 120 | None | | ≦1 | Vacuum | 1300 | 3 | 10 | 2 | 1650 | 2 |
| 121 | Ar | 5 | ≦1 | Vacuum | 1300 | 3 | 10 | 2 | 1650 | 2 |
| 122 | Ar | 10 | ≦1 | Vacuum | 1300 | 3 | 10 | 2 | 1650 | 2 |
| 123 | Ar | 15 | ≦1 | Vacuum | 1300 | 3 | 10 | 2 | 1650 | 2 |
| 124 | Ar | 24 | ≦1 | Vacuum | 1300 | 3 | 10 | 2 | 1650 | 2 |
| 125 | Ar | 36 | ≦1 | Vacuum | 1300 | 3 | 10 | 2 | 1650 | 2 |
| 126 | Ar | 30 | ≦1 | Vacuum | 1400 | 5 | 10 | 2 | 1600 | 2 |
| 127 | Ar | 30 | ≦1 | Vacuum | 1400 | 5 | 10 | 2 | 1600 | 2 |
| 128 | Ar | 30 | ≦1 | Vacuum | 1400 | 5 | 10 | 2 | 1600 | 2 |
| 129 | Ar | 30 | ≦1 | Vacuum | 1400 | 5 | 10 | 2 | 1600 | 2 |
| 130 | Ar | 30 | ≦1 | Vacuum | 1400 | 5 | 10 | 2 | 1600 | 2 |
| 131 | Ar | 30 | ≦1 | Vacuum | 1400 | 5 | 10 | 2 | 1600 | 2 |
| 132 | Ar | 30 | ≦1 | Vacuum | 1400 | 5 | 10 | 2 | 1600 | 2 |
| 133 | Ar | 30 | ≦1 | Vacuum | 1400 | 5 | 10 | 2 | 1600 | 2 |
| 134 | Ar | 30 | ≦1 | Vacuum | 1400 | 5 | 10 | 2 | 1600 | 2 |
| 135 | Ar | 30 | ≦1 | Vacuum | 1400 | 5 | 10 | 2 | 1600 | 2 |
| 136 | Ar | 30 | ≦1 | Vacuum | 1400 | 5 | 10 | 2 | 1600 | 2 |
| 137 | Ar | 30 | ≦1 | Vacuum | 1400 | 5 | 10 | 2 | 1600 | 2 |

| Sample | 2nd Pressurization | | | Final Sintering | | Cooling | |
|---|---|---|---|---|---|---|---|
| | Cooling Temp. (° C.) | Pressure (MPa) | Heating Speed (° C./min) | Temp. (° C.) | Hoding Time (hr) | Atmos. | Cooling Speed (° C./min) |
| 119 | 1200 | None | | 1750 | 2 | Ar | 5 |
| 120 | 900 | 50 | 2 | 1900 | 8 | Ar | 25 |
| 121 | 900 | 50 | 2 | 1900 | 8 | Ar | 25 |
| 122 | 900 | 50 | 2 | 1900 | 8 | Ar | 25 |
| 123 | 900 | 50 | 2 | 1900 | 8 | Ar | 25 |
| 124 | 900 | 50 | 2 | 1900 | 8 | Ar | 25 |
| 125 | 900 | 50 | 2 | 1900 | 8 | Ar | 25 |
| 126 | 950 | None | | 1900 | 10 | Ar | 30 |
| 127 | 950 | 5 | 2 | 1900 | 10 | Ar | 30 |
| 128 | 950 | 15 | 2 | 1900 | 10 | Ar | 30 |
| 129 | 950 | 30 | 2 | 1900 | 10 | Ar | 30 |
| 130 | 950 | 45 | 2 | 1900 | 10 | Ar | 30 |
| 131 | 950 | 60 | 2 | 1900 | 10 | Ar | 30 |
| 132 | 950 | 50 | 2 | 1900 | 10 | Ar | 1 |
| 133 | 950 | 50 | 2 | 1900 | 10 | Ar | 2 |
| 134 | 950 | 50 | 2 | 1900 | 10 | Ar | 5 |
| 135 | 950 | 50 | 2 | 1900 | 10 | Ar | 8 |
| 136 | 950 | 50 | 2 | 1900 | 10 | Ar | 15 |
| 137 | 950 | 50 | 2 | 1900 | 10 | Ar | 30 |

The relative density of each of thus obtained W sputtering targets was measured. The results are shown in Table 8.

Crystal planes of the surface of the respective W sputtering targets were analyzed by means of X-ray diffraction apparatus (XRD manufactured by RIKEN), thereby to measure the crystal orientation ratio $(211)/\{(110)+(200)+(211)+(220)+(310)\}$ of peaks corresponding to the crystal planes (110), (200), (211), (220) and (310), and a dispersion of the crystal orientation ratio. The measured results are shown in Table 8.

Using each of thus manufactured W sputtering targets, a sputtering operation was performed under the following conditions i.e., sputtering type: magnetron sputtering, back pressure; $1\times10^{-5}$ Pa, output power DC; 2 kW, Ar; 0.5 Pa, sputtering time; 5 min, thereby to form a W film on a 8-inch Si wafer.

A number of particles each having a diameter of 1 μm or more that were mixed in the W film was measured by means of a particle counter (WN-3). The measured results was averaged from 300 sheets of the wafers. These results are shown in Table 8 in conjunction with the other data.

TABLE 8

| Sample | Relative Density (%) | Crystal Orientation Ratio | Dispersion of Crystal Orientation Ratio (%) | Particle (pieces/wafer) |
| --- | --- | --- | --- | --- |
| 119 | 91.1 | 0.166 | 35.2 | 15.3 |
| 120 | 94.3 | 0.155 | 18.3 | 7.8 |
| 121 | 95.1 | 0.152 | 16.9 | 7.4 |
| 122 | 95.5 | 0.149 | 15.4 | 6.7 |
| 123 | 96.6 | 0.138 | 11.5 | 5.7 |
| 124 | 99.3 | 0.095 | 8.7 | 1.2 |
| 125 | 99.6 | 0.066 | 5.3 | 0.3 |
| 126 | 99.2 | 0.380 | 27.7 | 6.4 |
| 127 | 99.2 | 0.240 | 22.6 | 6.3 |
| 128 | 99.3 | 0.221 | 18.9 | 5.4 |
| 129 | 99.5 | 0.185 | 12.6 | 4.9 |
| 130 | 99.7 | 0.102 | 7.9 | 0.8 |
| 131 | 99.8 | 0.068 | 4.3 | 0.4 |
| 132 | 99.3 | 0.144 | 45.1 | 7.5 |
| 133 | 99.3 | 0.125 | 41.5 | 6.6 |
| 134 | 99.4 | 0.133 | 37.7 | 5.9 |
| 135 | 99.4 | 0.110 | 33.1 | 5.1 |
| 136 | 99.8 | 0.099 | 11.1 | 1.3 |
| 137 | 99.9 | 0.088 | 4.9 | 0.9 |

As is clear from the results shown in Table 8, the W sputtering targets in which the crystal orientation ratio $(211)/\{(110)+(200)+(211)+(220)+(310)\}$ of peaks corresponding to the crystal planes (110), (200), (211), (220) and (310), and a dispersion of the crystal orientation ratio analyzed by X-ray diffraction of a surface to be sputtered are controlled to be within the range specified by this invention of provide an excellent characteristic in reducing the generation of the particles each having a diameter of 1 μm or more in comparison with Comparative examples of which the crystal orientation ratio is outside range of this invention.

In the above Examples, although the case of the crystal orientation ratio (110)/(200) of the crystal planes (110), (200) and the crystal orientation ratio $(211)/\{(110)+(200)+(211)+(220)+(310)\}$ are separately explained, if the W sputtering target satisfies both of the above crystal orientation ratios, there can be obtained both an effect of improving the uniformity in film thickness and an effect of reducing the particles.

As described above, according to the W sputtering targets of the respective Examples, it is possible to improve the in-plain uniformity in thickness of the W film formed on a large-sized substrate, and also possible to further reduce the generation of the particles.

Example 7

High purity W powders were prepared, and each of these high purity W powders was pulverized by means of a ball mill under Ar atmosphere for the pulverizing time shown in Table 9. Thus obtained each of the pulverized W powders was packed in a carbon mold die and the mold die was set into a hot pressing apparatus. Then, each of the packed W powders was heated to a temperature shown in Table 9 and held for the holding time shown in Table 9 under a vacuum atmosphere of 1 Pa or lower thereby to perform a degassing treatment.

Subsequently, each of the degassed molded bodies was repeatedly subjected to a pressing/depressing cycle at a cycle number shown in Table 9. One cycle of the pressing/depressing cycle consists of: pressing the molded body to a pressure of 30 MPa; and depressing the molded body to a normal pressure. Thereafter, each of the degassed molded bodies was applied with a pressure of 10 MPa as a first pressurization and heated to an intermediate sintering temperature shown in Table 9 at a heating speed of 2° C./min, and held at the sintering temperature for 2 hours, thereby to perform the intermediate sintering.

After the above intermediate sintering step, each of the W sintered bodies was once cooled to a cooling temperature shown in Table 9. Each of the cooled W sintered bodies was applied with a pressure shown in Table 9 as a second pressurization, and heated to a final sintering temperature shown in Table 9 at a heating speed of 2° C./min, and held at the final sintering temperature for the holding time shown in Table 9, thereby to perform a final sintering. A cooling operation after the final sintering was performed by substituting Ar gas for the atmosphere, and a cooling speed to a normal temperature was set to a value shown in Table 9, thereby to obtain respective W sintered bodies as target materials.

Thus obtained W sintered bodies manufactured through the respective methods were then machine-worked so as to provide a size of the aimed target (diameter: 300 mm×thickness: 5 mm). After the surface of the target was subjected to a rotary grinding, a finishing work shown in Table 9 was performed. Thus obtained sputtering target was integrally bonded to a backing plate composed of Cu using an In type brazing material, whereby a several kinds of W sputtering targets were obtained (as samples 201-210).

TABLE 9

| Sample | Pulverizing Atmos. | Pulverizing Holding Time (hr) | Degssing Pressure (Pa) | Degssing Atmos. | Degssing Temp. (°C.) | Degssing Holding Time (hr) | Sitering Pressing/Depressing Cycle Pressure (MPa) | Sitering Pressing/Depressing Cycle Cycle of Pressurization (Cycle) | Sitering 1st Pressurization Pressure (MPa) | Sitering Intermediate Sintering Heating Speed (°C./min) | Sitering Intermediate Sintering Temp. (°C.) | Sitering Intermediate Sintering Holding Time (hr) |
|---|---|---|---|---|---|---|---|---|---|---|---|---|
| 201 | Ar | 24 | ≦1 | Vacuum | 1300 | 5 | 30 | 5 | 10 | 2 | 1600 | 2 |
| 202 | Ar | 24 | ≦1 | Vaccum | 1400 | 10 | 30 | 7 | 10 | 2 | 1600 | " |
| 203 | Ar | 30 | ≦1 | Vacuum | 1250 | 10 | 30 | 5 | 10 | 2 | 1650 | " |
| 204 | Ar | 30 | ≦1 | Vacuum | 1300 | 15 | 30 | 7 | 10 | 2 | 1700 | " |
| 205 | Ar | 30 | ≦1 | Vacuum | 1400 | 20 | 30 | 10 | 10 | 2 | 1700 | " |
| 206 | Ar | 48 | ≦1 | Vacuum | 1200 | 10 | 30 | 5 | 10 | 2 | 1600 | " |
| 207 | Ar | 48 | ≦1 | Vacuum | 1250 | 12 | 30 | 8 | 10 | 2 | 1650 | " |
| 208 | Ar | 48 | ≦1 | Vacuum | 1350 | 15 | 30 | 10 | 10 | 2 | 1750 | " |
| 209 | Ar | 48 | ≦1 | Vacuum | 1400 | 24 | 30 | 15 | 10 | 2 | 1750 | " |
| 210 | Ar | 60 | ≦1 | Vacuum | 1400 | 36 | 30 | 8 | 10 | 2 | 1600 | " |

| Sample | Sitering 2nd Pressurization Cooling Temp. (°C.) | Sitering 2nd Pressurization Pressure (MPa) | Sitering 2nd Pressurization Heating Speed (°C./min) | Final Sintering Temp. (°C.) | Final Sintering Holding Time (hr) | Cooling Atmos. | Cooling Cooling Spped (°C./min) | Finishing Work |
|---|---|---|---|---|---|---|---|---|
| 201 | 800 | 40 | 2 | 1900 | 10 | Ar | 15 | Polishing with diamond abrasive grain |
| 202 | 850 | 50 | 2 | 1900 | 15 | Ar | 25 | Polishing with diamond abrasive grain and Etching with red prussiate sol. for 3 min. |
| 203 | 800 | 40 | 2 | 1900 | 10 | Ar | 15 | Polishing with G.C. grind stone |
| 204 | 850 | 45 | 2 | 1950 | 15 | Ar | 25 | Polishing with diamond abrasive grain and Etching with red prussiate sol. for 3 min. |
| 205 | 900 | 60 | 2 | 1950 | 20 | Ar | 30 | Polishing with diamond abrasive grain and Etching with red prussiate sol for 15 min. |
| 206 | 800 | 40 | 2 | 1900 | 10 | Ar | 20 | Polishing with diamond abrasive grain |
| 207 | 850 | 50 | 2 | 1900 | 15 | Ar | 30 | Polishing with G.C. grind stone |
| 208 | 900 | 60 | 2 | 2000 | 20 | Ar | 30 | Polishing with diamond abrasive grain and Etching with red prussiate sol. for 3 min. |
| 209 | 1000 | 60 | 2 | 2000 | 30 | Ar | 40 | Polishing with diamond abrasive grain and Etching with red prussiate sol. for 20 min. |
| 210 | 850 | 40 | 2 | 1900 | 24 | Ar | 20 | Polishing with diamond abrasive grain and Etching with red prussiate sol. for 30 min. |

The relative density of each of thus obtained W sputtering targets was measured.

Further, the crystal planes of the surface of the respective W sputtering targets were analyzed by means of X-ray diffraction apparatus (XRD manufactured by RIKEN), thereby to measure the half band width of a peak corresponding to the crystal plane (110) and a dispersion of the crystal orientation ratio. The measured results are shown in Table 10.

Further, the crystal orientation ratio $\hat{1}$ (110)/(200) of peaks corresponding to the crystal planes (110), (200), and a dispersion of the crystal orientation ratio were measured. The measured results are also shown in Table 10.

Furthermore, the crystal orientation ratio $\hat{2}$ (211)/{(110)+(200)+(211)+(220)+(310)} of peaks corresponding to the crystal planes (110), (200), (211), (220) and (310), and a dispersion of the crystal orientation ratio were measured. The measured results are also shown in Table 10.

In this connection, an impurity content (a total amount of Fe, Ni, Cr, Cu, Al, Na, K, U and Th) contained in the respective targets was 10 ppm or less.

Using each of thus manufactured W sputtering targets, a sputtering operation was performed under the following conditions i.e., sputtering type: magnetron sputtering, back pressure; $1\times10^{-5}$ Pa, output power DC; 2 kW, Ar; 0.5 Pa, sputtering time; 5 min, thereby to form a W film on a 8-inch Si wafer. In order to evaluate a uniformity in thickness of the W film, the film thickness was measured with respect to measuring points on a diameter line at interval of 5 mm from a peripheral portion of the Si wafer substrate. From a maximum value and a minimum value of the measured thickness data, the uniformity in thickness was calculated on the basis of the following equation.

Uniformity in Film Thickness (%)={(maximum value−minimum value)/(maximum value+minimum value)}×100

These results are shown in Table 10 in conjunction with the other data.

Further, a number of particles each having a diameter of 1 μm or more that were mixed in the resultant W film was measured by means of a particle counter (WN-3). The measured results was averaged from 300 sheets of the wafers.

These results are also shown in Table 10 in conjunction with the other data.

TABLE 10

| Sample | Relative Density (%) | (110)Half Band Width | Dispersion of (110)Half Band Width (%) | Crystal Orientation Ratio ① | Dispersion of Crystal Orientation Ratio ① (%) | Crystal Orientation Ratio ② | Dispersion of Crystal Orientation Ratio ② (%) | Uniformity in Film Thickness (%) | Particles (pieces/wafer) |
|---|---|---|---|---|---|---|---|---|---|
| 201 | 99.1 | 0.28 | 27.8 | 5.5 | 33.1 | 0.15 | 15.4 | 0.88 | 1.8 |
| 202 | 99.5 | 0.19 | 20.1 | 2.1 | 10.7 | 0.08 | 7.8 | 0.54 | 0.8 |
| 203 | 99.3 | 0.31 | 14.3 | 6.1 | 45.9 | 0.16 | 25.6 | 0.92 | 1.5 |
| 204 | 99.5 | 0.22 | 18.6 | 3.4 | 31.1 | 0.11 | 14.1 | 0.84 | 0.6 |
| 205 | 99.7 | 0.14 | 20.6 | 1.1 | 12.6 | 0.04 | 7.9 | 0.57 | 0.42 |
| 206 | 99.1 | 0.33 | 8.9 | 4.9 | 22.2 | 0.10 | 23.9 | 0.66 | 1.4 |
| 207 | 99.3 | 0.24 | 16.6 | 3.3 | 18.4 | 0.06 | 10.3 | 0.41 | 0.8 |
| 208 | 99.9 | 0.11 | 28.1 | 4.2 | 9.8 | 0.05 | 6.5 | 0.32 | 0.4 |
| 209 | 99.9 | 0.05 | 2.9 | 0.9 | 5.5 | 0.02 | 4.1 | 0.66 | 0.2 |
| 210 | 99.8 | 0.09 | 5.4 | 1.9 | 11.9 | 0.08 | 6.7 | 0.38 | 0.8 |

Crystal Orientation Ratio ①:(110)/(200)
Crystal Orientation Ratio ②:(211)/[(110) + (200) + (211) + (220) + (310)]

As is clear from the results shown in Table 10, the W sputtering targets having a specified half band width of the crystal plane (110) of a peak analyzed by X-ray diffraction of a surface to be sputtered, or the W sputtering targets having a specified dispersion of the half band width of the crystal plane (110), or the W sputtering targets having a specified crystal orientation ratio (110)/(200), or the W sputtering targets having a specified dispersion of the crystal orientation ratio (110)/(200), or the W sputtering targets in which the crystal orientation ratio (211)/{(110)+(200)+(211)+(220)+(310)} of peaks corresponding to the crystal planes (110), (200), (211), (220) and (310), and a dispersion of the crystal orientation ratio analyzed by X-ray diffraction of a surface to be sputtered are controlled to be within the range specified by this invention are excellent in uniformity in film thickness and can provide an excellent characteristic in reducing the generation of the particles each having a diameter of 1 μm or more in comparison with Comparative Examples of which the crystal orientation ratio is outside range of this invention.

INDUSTRIAL APPLICABILITY

As is clear from the above explanations, according to the high purity W sputtering target of the present invention, it becomes possible to effectively improve an in-plain uniformity in thickness of the W film. As a result, when the W film is used as electrodes or wirings or the like of the semiconductor devices, a reliability of the semiconductor device can be greatly improved, and a production yield of the devices can be also improved.

Further, according to the method of manufacturing the high purity W target of the present invention, it becomes possible to obtain a W sputtering target capable of obtaining an excellent in-plain uniformity in thickness of the resultant W thin film.

The invention claimed is:

1. A method of manufacturing a tungsten sputtering target, the method comprising the steps of:
   pressing a high purity tungsten powder to form a pressed compact;
   first sintering the pressed compact at a temperature of 1450-1700° C. for one hour or longer after the pressed compact is heated at a heating-up rate of 2-5° C./min on the way to a maximum sintering temperature;
   second sintering the pressed compact to form a sintered body at a temperature of 1900° C. or higher for 5 hours or longer;
   working the sintered body to obtain a shape of a target;
   subjecting the target to a grinding work of at least one of rotary grinding and polishing; and
   subjecting the target to a finishing work of at least one of etching and reverse sputtering.

* * * * *